(12) United States Patent
Lin et al.

(10) Patent No.: US 8,471,460 B1
(45) Date of Patent: Jun. 25, 2013

(54) PHOSPHOR

(75) Inventors: Chun-Che Lin, Hsinchu (TW); Ru-Shi Liu, Hsinchu (TW); Ming-Chi Hsu, Hsinchu (TW); Chih-Ming Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/440,322

(22) Filed: Apr. 5, 2012

(51) Int. Cl.
*H01J 1/62* (2006.01)
(52) U.S. Cl.
USPC .............................. 313/503; 428/690; 257/98
(58) Field of Classification Search
USPC .............................. 257/98; 428/690; 313/503
See application file for complete search history.

(56) References Cited

U.S. PATENT DOCUMENTS

| 7,351,356 | B2 | 4/2008 | Delsing et al. |
| 7,951,306 | B2 | 5/2011 | Tamaki et al. |

*Primary Examiner* — Donald Raleigh
(74) *Attorney, Agent, or Firm* — Ditthavong Mori & Steiner, P.C.

(57) ABSTRACT

A phosphor comprising an oxynitride compound having a chemical formula of $A_{2-m}E_3O_2N_4:M_m$, wherein A comprises an alkaline-earth element, E comprises a IVA group element, M is an activator comprising a bivalent rare-earth element, and $0.00001 \leq m \leq 1.0$, wherein A is at least one element selected from the group consisting of Mg, Ca, Sr and Ba; E is at least one element selected from the group consisting of C, Si, Ge, and Sn; and M is at least one element selected from the group consisting of Lu, Sc, La, Gd, Tb, Eu, and Sm.

15 Claims, 3 Drawing Sheets

PHOSPHOR

TECHNICAL FIELD

The application relates to a phosphor, and more particularly, to a phosphor comprising an oxynitride compound, and the application thereof.

DESCRIPTION OF BACKGROUND ART

Recently, the advanced countries promote green energy based on the energy conservation and the environmental awareness. The white light emitting diode (LED) gradually replaces the traditional lighting because the white light emitting diode has the advantages of small volume, low electric power consumption, long lifetime up to 100,000 hours, low heat dissipation and short response time, and therefore the white light emitting diode can be applied to the miniaturization application equipment and also be operated under high frequency. The electricity consumption of the white light emitting diode is eighth to tenth of the conventional light bulb, and half of the fluorescent lamp. So, the thermal radiation of the white light emitting diode is also low when compared with the traditional lighting. The white light emitting diode has been considered as a new light source in the twenty-first century with the characteristics of energy saving and environmental protection.

The white light provided by using a blue light-emitting diode with a yellow phosphor is the mature technology in the industry. In 1996, Japan's Nichia (Nichia Chemical) developed a high-efficiency white light source by providing a series of yellow yttrium aluminum garnet phosphors ($Y_3Al_5O_{12}$:Ce, YAG:Ce) with the indium gallium nitride (InGaN) based blue light-emitting diode. The white light LED adopts a complementary relation between the blue emission of the InGaN-based light-emitting diode and the yellow emission of the YAG-based phosphor, so the red emission is insufficient. Furthermore, the luminous efficiency of the YAG-based phosphor at high environment temperature decreases accompanied with the increase of environment temperature. Therefore, the CRI (Color Rendering Index) of the conventional white light LED is approximately 70 to 80, and is not high enough for many applications like lighting and display.

SUMMARY OF THE APPLICATION

A phosphor comprising an oxynitride compound having a chemical formula of $A_{2-m}E_3O_2N_4$:$M_m$, wherein A comprises an alkaline-earth element, E comprises a IVA group element, M is an activator comprising a bivalent rare-earth element, and $0.00001 \leq m \leq 1.0$, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm.

DETAILED DESCRIPTION OF PREFERRED EMBODIMENTS

Figure 1:
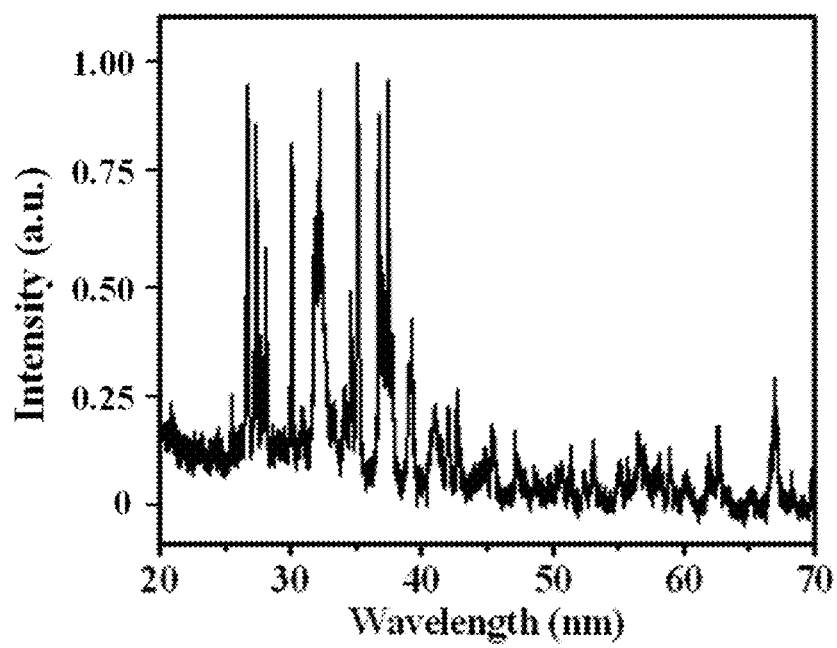
FIG. 1 illustrates an X-ray diffraction diagram of $Ca_{1.98}Si_3O_2N_4$:$En_{0.02}$.

The embodiment of the application is illustrated in detail, and is plotted in the drawings. The same or the similar part is illustrated in the drawings and the specification with the same number.

The present application discloses a phosphor comprising an oxynitride compound having a chemical formula of $A_{2-m}E_3O_2N_4$:$M_m$, wherein A comprises an alkaline-earth element, E comprises a IVA group element, M is an activator comprising a bivalent rare-earth element, and $0.00001 \leq m \leq 1.0$, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm.

The oxynitride compound as disclosed in the present application can be synthesized by solid-state reaction, chemical synthesis, citrate gelation process, or spray pyrolysis. This embodiment is exemplified by solid-state reaction for the illustration of synthesis of $Ca_{1.98}Si_3O_2N_4$:$Eu_{0.02}$. The method includes steps of preparing a first reactant comprising Ca such as $CaCO_3$, a second reactant comprising Si such as $Si_3N_4$, and a third reactant comprising Eu such as $Eu_2O_3$ with stoichiometric amount. Then the first reactant, the second reactant, and the third reactant are thoroughly mixed and ground in a mortar. Next, the mixed reactants are put into a furnace. In the first step of the process, a nitrogen gas is introduced into the furnace and the pressure is set between 0.3-0.9 MPa, preferably to be 0.9 MPa. At this time, the mixed reactants are fired under a furnace temperature between 1100-1700, preferably 1100° C. for 2 hours. In the second step of the process, the nitrogen gas is continually introduced into the furnace and the pressure is set to be between 0.3-0.9 MPa, preferably 0.9 MPa. At this time, the mixed reactants are fired under a furnace temperature between 1100-1700° C., preferably 1450° C. for 1 hours. In the third step of the process, a nitrogen gas is continually introduced into the furnace and the pressure is set to be between 0.3-0.9 MPa, preferably 0.9 MPa. At this time, the mixed reactants are fired under a furnace temperature between 1100-1700, preferably 1650° C. for 1 hours. In sum, the furnace temperature of the second step is preferably higher than that of the first step, and the furnace temperature of the third step is preferably higher than that of the second step. Afterward, the red powder of the oxynitride compound $Ca_{1.98}Si_3O_2N_4$:$Eu_{0.02}$ is provided.

FIG. 1 shows an X-ray diffraction diagram of $Ca_{1.98}Si_3O_2N_4$:$Eu_{0.02}$ in accordance with embodiments of the present application. From the comparison between the sample provided by the present application and the standard sample of oxynitride compound $Ca_2Si_3O_2N_4$, the structure of $Ca_{1.98}Si_3O_2N_4$:$Eu_{0.02}$ in accordance with the present application is orthorhombic ($a \neq b \neq c$, $\alpha = \beta = \gamma = 90°$).

Figure 2:
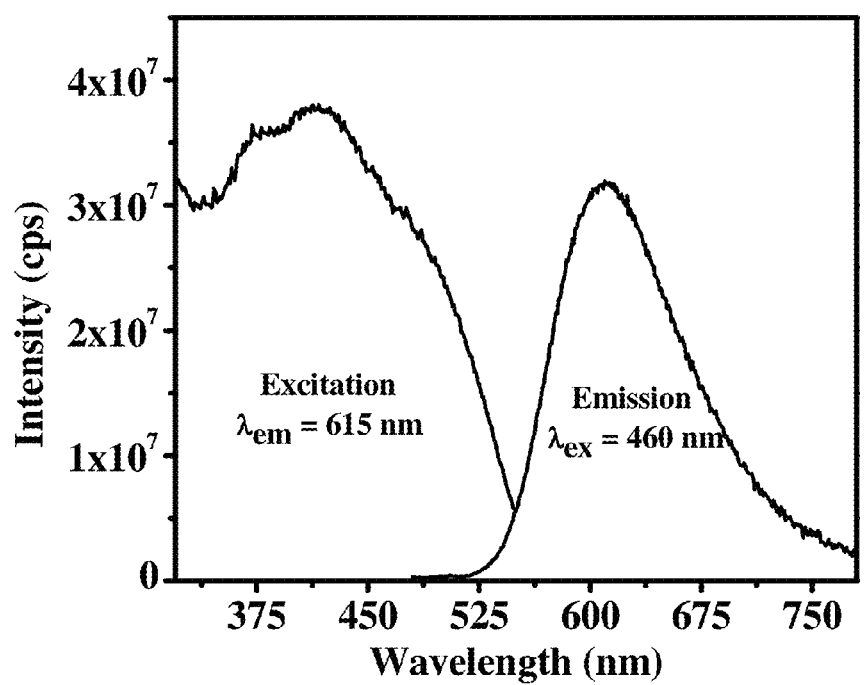
FIG. 2 illustrates a diagram of emission and excitation spectrum of $Ca_{1.98}Si_3O_2N_4$:$Eu_{0.02}$.

FIG. 2 shows a diagram of emission and excitation spectrum of $Ca_{1.98}Si_3O_2N_4$:$Eu_{0.02}$ in accordance with the present application. The phosphor of $Ca_{1.98}Si_3O_2N_4$:$Eu_{0.02}$ in accordance with the present application is favorable to be excited by ultra-violet (UV) light or blue light, or UV light to near-UV light with wavelength spectrum between 200 nm and 500 nm, and more favorable to be excited by wavelength between 360 nm and 480 nm to achieve better light emitting characteristics.

As shown in FIG. 2, the phosphor $Ca_{1.98}Si_3O_2N_4:Eu_{0.02}$ is excited by a first light having a dominant wavelength between 360 nm and 480 nm to emit a second light having a dominant wavelength between 525 nm and 760 nm. In an embodiment of the application, the phosphor $Ca_{1.98}Si_3O_2N_4:Eu_{0.02}$ is excited by the blue light having a dominant wavelength 460 nm to emit a red light having a dominant wavelength between 525 nm and 760 nm. The highest light emission intensity of the phosphor $Ca_{1.98}Si_3O_2N_4:Eu_{0.02}$ is around wavelength of 615 nm.

Figure 3:
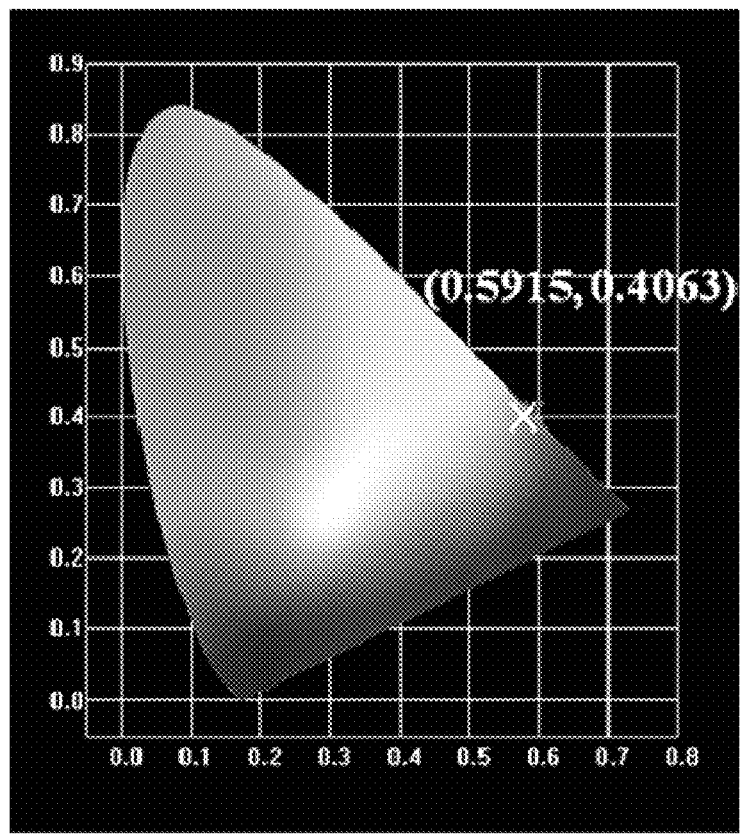
FIG. 3 illustrates a CIE chromaticity chart of $Ca_{1.98}Si_3O_2N_4$:$En_{0.02}$.

In an embodiment of the application, the oxynitride compound having the chemical formula of $A_{2-m}E_3O_2N_4:M_m$ is excited by UV light or blue light to emit the red light having the dominant wavelength between 525 nm and 760 nm, wherein a chromaticity coordinate x of the second light is between 0.49 and 0.69, and a chromaticity coordinate y of the second light is between 0.31 and 0.51. FIG. 3 shows a CIE chromaticity chart of $Ca_{1.98}Si_3O_2N_4:Eu_{0.02}$ in accordance with the present application. As shown in FIG. 3, point x represents the location of $Ca_{1.98}Si_3O_2N_4:Eu_{0.02}$ on the chromaticity diagram with a coordinate of (0.5915, 0.4063).

Figure 4:
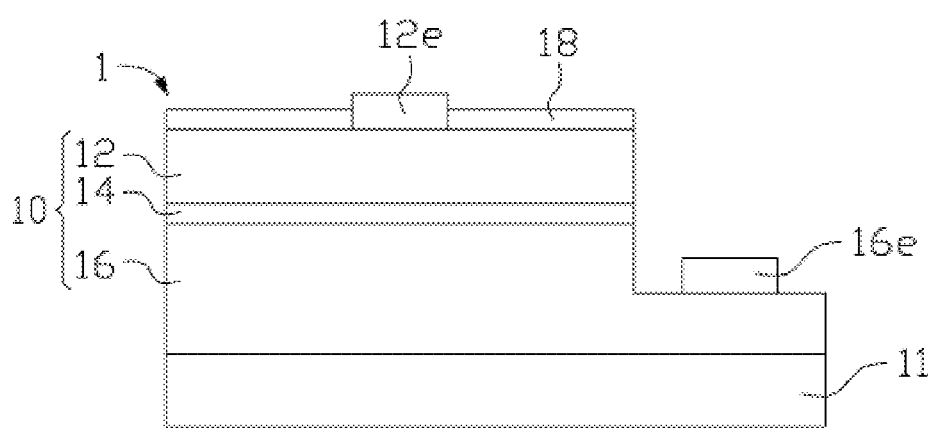
FIG. 4 illustrates an optoelectronic apparatus using an oxynitride compound of the present application.
Figure 5:
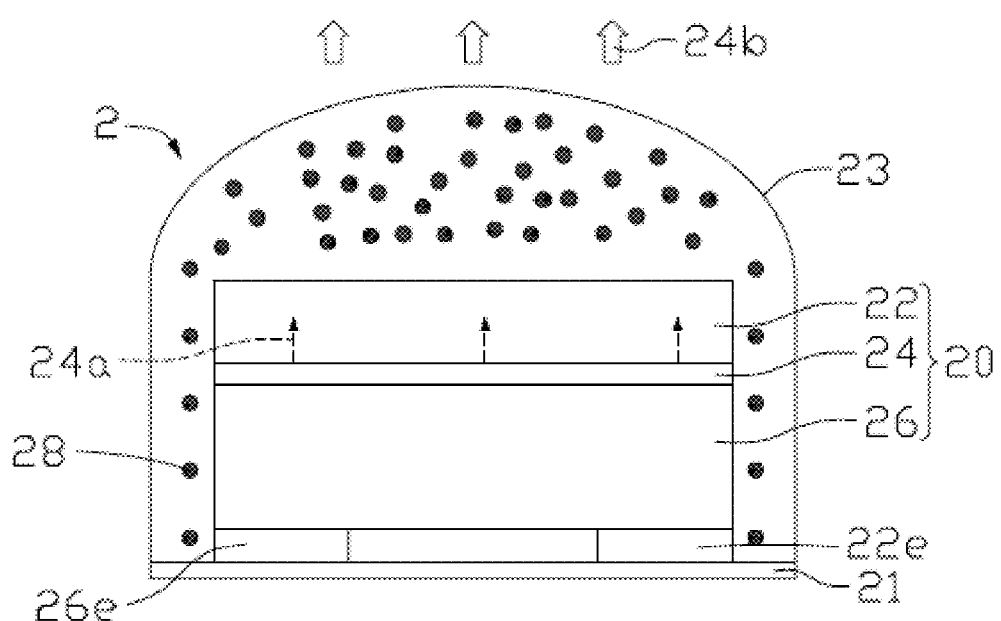
FIG. 5 illustrates an optoelectronic apparatus using an oxynitride compound of the present application.

The phosphor of oxynitride compound provided in the present application can be extensively applied to various optoelectronic devices such as light-emitting diode, plasma emission device, and other solid-state illumination device. FIGS. 4-5 show an embodiment of optoelectronic apparatus associated with the phosphor of oxynitride compound. As shown in FIG. 4, an optoelectronic apparatus 1 comprises a light-emitting device 10 capable of radiating a first light with a dominant wavelength formed on a support substrate 11, wherein the light-emitting device 10 comprises a first conductivity type semiconductor layer 12, a second conductivity type semiconductor layer 16, and an active layer 14 formed between the first conductivity type semiconductor layer 12 and the second conductivity type semiconductor layer 16. The optoelectronic apparatus 1 further comprises a first electrode 12e electrically connected to the first conductivity type semiconductor layer 12 and a second electrode 16e electrically connected to the second conductivity type semiconductor layer 16; and a phosphor 18 positioned on the light-emitting device 10 for receiving the first light and comprising an oxynitride compound having a chemical formula of $A_{2-m}E_3O_2N_4:M_m$, wherein A comprises an alkaline-earth element, E comprises a IVA group element, M is an activator comprising a bivalent rare-earth element, and $0.00001 \leq m \leq 1.0$, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm. The phosphor is capable of being excited by the first light having a first dominant wavelength between 360 nm and 480 nm to emit a second light having a second dominant wavelength between 525 nm and 760 nm.

As shown in FIG. 5, an optoelectronic apparatus 2 comprises a light-emitting device 20 capable of radiating a first light 24a with a dominant wavelength between 360 nm and 480 nm formed on a circuit board 21 comprising a circuit thereon, wherein the light-emitting device 20 comprises a first conductivity type semiconductor layer 22, a second conductivity type semiconductor layer 26, and an active layer 24 formed between the first conductivity type semiconductor layer 22 and the second conductivity type semiconductor layer 26. The optoelectronic apparatus 2 further comprises a first electrode 22e electrically connected between the first conductivity type semiconductor layer 22 and the circuit board 21; a second electrode 26e electrically connected between the second conductivity type semiconductor layer 26 and the circuit board 21; a phosphor 28 positioned for receiving the first light 24a; and a transparent encapsulating layer 23 formed on the circuit board 21 and covering the light-emitting device 20, wherein the phosphor 28 is distributed in the transparent encapsulating layer 23 for receiving the first light 24a to emit a second light 24b having a second dominant wavelength between 525 nm and 760 nm. The phosphor comprises an oxynitride compound having a chemical formula of $A_{2-m}E_3O_2N_4:M_m$, wherein A comprises an alkaline-earth element, E comprises a IVA group element, M is an activator comprising a bivalent rare-earth element, and $0.00001 \leq m \leq 1.0$, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A phosphor comprising an oxynitride compound having a chemical formula of $A_{2-m}E_3O_2N_4:M_m$, wherein A comprises an alkaline-earth element, E comprises a WA group element, M is an activator comprising a bivalent rare-earth element, and $0.00001 \leq m \leq 1.0$.

2. The phosphor according to claim 1, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm.

3. The phosphor according to claim 1, wherein the phosphor is capable of being excited by UV or blue light.

4. The phosphor according to claim 1, wherein the phosphor is capable of being excited by a first light having a dominant wavelength between 360 nm and 480 nm.

5. The phosphor according to claim 1, wherein the phosphor is capable of being excited to emit red light.

6. The phosphor according to claim 1, wherein the phosphor is capable of being excited to emit a second light having a dominant wavelength between 525 nm and 760 nm.

7. The phosphor according to claim 6, wherein a chromaticity coordinate x of the second light is between 0.49 and 0.69, and a chromaticity coordinate y of the second light is between 0.31 and 0.51.

8. A method of synthesizing the phosphor according to claim 1, comprising the steps of:
providing a mixture of precursors containing $CaCO_3$, $SiN_x$, and $Eu_2O_3$; and firing the mixture in a furnace under a condition of a temperature between 1100° C. and 1700° C., a pressure between 0.3 MPa and 0.9 MPa, and/or an atmosphere containing nitrogen gas.

9. An optoelectronic apparatus, comprising:
a light-emitting device capable of radiating a first light with a dominant wavelength; and
a phosphor positioned for receiving the first light, comprising an oxynitride compound having a chemical formula of $A_{2-m}E_3O_2N_4:M_m$, wherein A comprises an alkaline-earth element, E comprises a IVA group element, M is an activator comprising a bivalent rare-earth element, and $0.00001 \leq m \leq 1.0$.

10. The optoelectronic apparatus according to claim 9, wherein A is at least one element selected from the group consisting of Mg, Ca, Sr, and Ba; E is at least one element selected from the group consisting of C, Si, Ge, and Sn; and M is at least one element selected from the group consisting of Lu, Sc, La, Gd, Tb, Eu, and Sm.

11. The optoelectronic apparatus according to claim 9, wherein the phosphor is capable of being excited by the first light having a first dominant wavelength between 360 nm and 480 nm.

12. The optoelectronic apparatus according to claim 11, wherein the phosphor is capable of being excited to emit a second light having a second dominant wavelength between 525 nm and 760 nm.

13. The optoelectronic apparatus according to claim 9, wherein the light-emitting device comprises a first conductivity type semiconductor layer, a second conductivity type semiconductor layer, and an active layer formed between the first conductivity type semiconductor layer and the second conductivity type semiconductor layer.

14. The optoelectronic apparatus according to claim 9, further comprising:
- a circuit board comprising a circuit thereon, where the light-emitting device is formed thereon; and
- a transparent encapsulating material formed on the circuit board and covering the light-emitting device, wherein the phosphor is distributed in the transparent encapsulating material.

15. The optoelectronic apparatus according to claim 14, further comprising a first electrode electrically connected between the first conductivity type semiconductor layer and the circuit board, and a second electrode electrically connected between the second conductivity type semiconductor layer and the circuit board.

* * * * *